US006873144B2

(12) United States Patent
Slater et al.

(10) Patent No.: US 6,873,144 B2
(45) Date of Patent: Mar. 29, 2005

(54) ELECTRONIC METER HAVING RANDOM ACCESS MEMORY WITH PASSIVE NONVOLATILITY

(75) Inventors: Byron J. Slater, Lafayette, IN (US); Gordon R. Burns, Lafayette, IN (US); John T. Voisine, Lafayette, IN (US)

(73) Assignee: Landis+Gyr Inc., Lafayette, IN (US)

( * ) Notice: Subject to any disclaimer, the term of this patent is extended or adjusted under 35 U.S.C. 154(b) by 163 days.

(21) Appl. No.: 09/828,701

(22) Filed: Apr. 6, 2001

(65) Prior Publication Data

US 2002/0036492 A1 Mar. 28, 2002

Related U.S. Application Data

(60) Provisional application No. 60/195,660, filed on Apr. 7, 2000.

(51) Int. Cl.[7] .............................................. G01R 21/06
(52) U.S. Cl. ....................................... 324/142; 702/61
(58) Field of Search ........................... 324/142; 702/60, 702/61, 62, 63, 64

(56) References Cited

U.S. PATENT DOCUMENTS

| 5,173,873 A | 12/1992 | Wu et al. .................... 365/173 |
| 5,396,455 A | 3/1995 | Brady et al. ................ 365/170 |
| 5,467,286 A | 11/1995 | Pyle et al. ................... 702/62 |
| 5,477,482 A | 12/1995 | Prinz ........................... 365/129 |
| 5,495,167 A | 2/1996 | Cotroneo .................... 324/74 |
| 5,537,029 A | 7/1996 | Hemminger et al. ........ 324/142 |
| 5,546,318 A | 8/1996 | Lee, Jr. ........................ 702/61 |
| 5,548,527 A * | 8/1996 | Hemminger et al. .......... 702/62 |
| 5,691,936 A | 11/1997 | Sakakima et al. ........... 365/158 |
| 5,715,390 A * | 2/1998 | Hoffman et al. ............. 324/142 |
| 5,793,697 A | 8/1998 | Scheuerlein ........... 365/230.07 |
| 5,831,428 A * | 11/1998 | Pyle et al. ................... 324/142 |
| 5,831,550 A * | 11/1998 | Sigiliao Da Costa et al. .... 324/142 |
| 5,924,051 A * | 7/1999 | Provost et al. .............. 324/142 |
| 5,991,706 A * | 11/1999 | Tsukamoto et al. ......... 702/182 |
| 6,020,734 A | 2/2000 | Grisham et al. ............. 324/142 |
| 6,043,642 A | 3/2000 | Martin et al. ............... 324/142 |
| 6,262,672 B1 * | 7/2001 | Brooksby et al. ............. 702/62 |
| 6,323,650 B1 * | 11/2001 | Bertness et al. .............. 702/63 |
| 6,351,223 B1 * | 2/2002 | DeWeerd et al. ...... 340/870.03 |
| 6,429,785 B1 * | 8/2002 | Griffin et al. .......... 340/870.02 |
| 6,459,258 B1 * | 10/2002 | Lavoie et al. ............... 324/142 |
| 6,486,652 B1 * | 11/2002 | Ouellette et al. ........... 324/142 |
| 6,564,159 B1 * | 5/2003 | Lavoie et al. ................. 702/62 |

* cited by examiner

Primary Examiner—Ernest Karlsen
(74) Attorney, Agent, or Firm—Maginot, Moore & Beck

(57) ABSTRACT

An arrangement for generating and storing metering information in a meter for measuring a consumed commodity includes a processing circuit and a non-volatile, rewriteable random access memory. The processing circuit is operable to generate metering information. The non-volatile, rewriteable random access memory stores metering information during normal operation, and is operable to retain the stored metering information in the absence of external electrical power.

13 Claims, 3 Drawing Sheets

ELECTRONIC METER HAVING RANDOM ACCESS MEMORY WITH PASSIVE NONVOLATILITY

This application claims the benefit of U.S. Provisional Patent Application Ser. No. 60/195,660, filed Apr. 7, 2000, and which is incorporated herein by reference.

FIELD OF THE INVENTION

The present invention relates generally to utility meters, and more particularly, to utility meters having various memory requirements.

BACKGROUND OF THE INVENTION

Utility service providers employ utility meters to meter or measure the usage of a utility commodity, such as water, gas, or electricity, by customers. Some utility meters furthermore meter energy that is delivered from one service provider to another. Recently, utility meters, including electricity meters, have employed microcontroller, microprocessor and/or digital signal processor technology to perform metering calculations. The use of such processing devices has facilitated more sophisticated data gathering techniques and has allowed for better analysis of commodity usage patterns and needs.

One particular architecture that enjoys significant use in electricity meters is based on a two processor core. Exemplary meters having such an architecture are described in U.S. Pat. Nos. 6,043,642 and 6,020,734, which are assigned to the assignee hereof and incorporated herein by reference. In this architecture, one processor is primarily used to perform raw energy, power, or rms calculations on instantaneous samples and the other processor is primarily used to control the meter components and to convert the raw calculations into final metering information that may be displayed or communicated externally. Variations on this core architecture include those that employ additional processors for other operations. It is also possible that a single processor may be used to accomplish the aforementioned tasks.

The two processor core architecture typically requires a variety of memory devices which are selected to address the varying memory needs of the processor based electricity meter. Random access memory ("RAM") is typically used for interim calculations performed by the processors as well as for local storage of program code. RAM is often internal to one or more of the processor chips. Read only memory, also often internal to the processor chips, provides non-volatile, non-rewriteable storage for the main program code.

There are also several uses for a writeable non-volatile memory in an electricity meter. Such uses include the maintenance of metering data in the event of a power outage, the storage of calibration parameters, and potentially the storage of actual processor code that is field-replaceable. In addition, writeable non-volatile memory has been used for the storage of load profiling information, which comprises energy usage statistics for consecutive time slots over a month's duration or longer. Non-volatile memory is required to preserve the information in the event that power to the meter is interrupted.

Historically, writeable, non-volatile memory requirements have been filled, at least in part, by electronically erasable programmable read only memory ("EEPROM") devices. However, such devices are limited in access speed, the number of usable write cycles, and power consumption. As a result, the use of EEPROM devices is preferably limited to only those applications in which rewriteable non-volatile memory is absolutely necessary. Thus, for example, the storage of metering data in non-volatile EEPROM is often limited in order to avoid unduly shortening the useful life of the EEPROM.

Moreover, for load profiling information in a meter, which may be written in excess of one hundred times per day, EEPROM technology is not typically used. Instead, battery-backed RAM arrangements have been employed to store load profiling information. The battery-backed RAM has the advantage of allowing substantially more write-cycles than EEPROM, and further has other advantages typically associated with random access memory. However, ordinary RAM loses its information in the absence of electrical bias power. Accordingly, to maintain load-profiling information in the event of a power interruption, batteries are employed as back-up bias power for the RAM.

FIG. 1 shows a prior art utility meter circuit 10. The utility meter circuit 10 may suitably be an electricity meter that includes a load profiling functionality. The meter 10 includes a processor 12, a measurement signal source 14, a primary power source 16, a volatile RAM 18, an EEPROM 20, a battery-backed RAM 22, a display 24, and a battery circuit 26.

The primary power source 16 is operably connected to provide bias power to the components of the utility meter circuit 10, including the processor 12, the measurement signal source 14, the volatile RAM 18, the EEPROM 20, the battery-backed RAM 22 and the display 24. The primary power source 16 may suitably be a power supply that is coupled to utility electrical power.

The measurement signal source 14 includes a circuit that is operable to generate commodity consumption signals that are representative of the use of a particular commodity to be metered. For example, the measurement signal source 14 may suitably be a source of electrical energy consumption signals. The processor 12 is coupled to receive the commodity consumption signals form the measurement signal source 14 and generate useful metering information therefrom. The processor 12 stores such information in the RAM 18 and periodically provides the information to the display 24.

The EEPROM 20 is coupled to periodically receive metering information from the processor 12. The EEPROM 20 stores such metering information in order to preserve the information in the event of a power interruption to the meter circuit 10. The EEPROM 20 may also store calibration parameters of the meter circuit 10. The battery-backed RAM 22 is employed to store commodity consumption statistical data, for example, load profiling information. Such information is typically too voluminous, and/or requires too many read-write cycles to conveniently be stored in the EEPROM 20. The battery circuit 26 is operably coupled to the battery-backed RAM 22 to provide bias power to the RAM 22 in the event of a power interruption.

The requirement of batteries to provide back-up power in the event of a power outage undesirably increases the size and component cost of the meter. Because of the increased inconvenience associated with the use of batteries, many meters include battery-backed RAM circuitry only when the meter application is specified for load profiling capabilities.

It is also noted that the requirement of multiple types of memories, such as RAM, ROM, EEPROM, and battery-backed RAM in meters has drawbacks related to software implementation, wiring and control. There is a need therefore, for more efficient memory configurations in electricity meters, as well as possibly other types of meters.

SUMMARY OF THE INVENTION

The present invention addresses the above-described needs, as well as others, by providing a method and arrangement for generating and storing metering information in a commodity consumption meter that employs a rewriteable nonvolatile random access memory for storing various metering information. The rewriteable nonvolatile random access memory provides has several advantageous characteristics as compared to EEPROM, and may be used to replace two or more types of memories in a conventional prior art meter processing circuit.

In one embodiment of the present invention, an arrangement for generating and storing metering information in a meter for measuring a consumed commodity includes a processing circuit and a non-volatile, rewriteable random access memory. The processing circuit is operable to generate metering information. The a non-volatile, rewriteable random access memory stores metering information during normal operation, and is operable to retain the stored metering information in the absence of external electrical power.

Preferably the non-volatile, rewriteable random access memory is further operable to store calibration parameters and/or metering information in the form of historical statistics, for example, load profiling information. As a result, the present invention only requires one memory where the prior art required at least two types of nonvolatile memory.

In another embodiment of the present invention, the non-volatile, rewriteable random access memory may also be used to store program code, thus eliminating the step of downloading program code from non-volatile EEPROM or the like to RAM.

The above described features and advantages, as well as others, will become more readily apparent to those of ordinary skill in the art by reference to the following detailed description and accompanying drawings.

DETAILED DESCRIPTION

Figure 1:
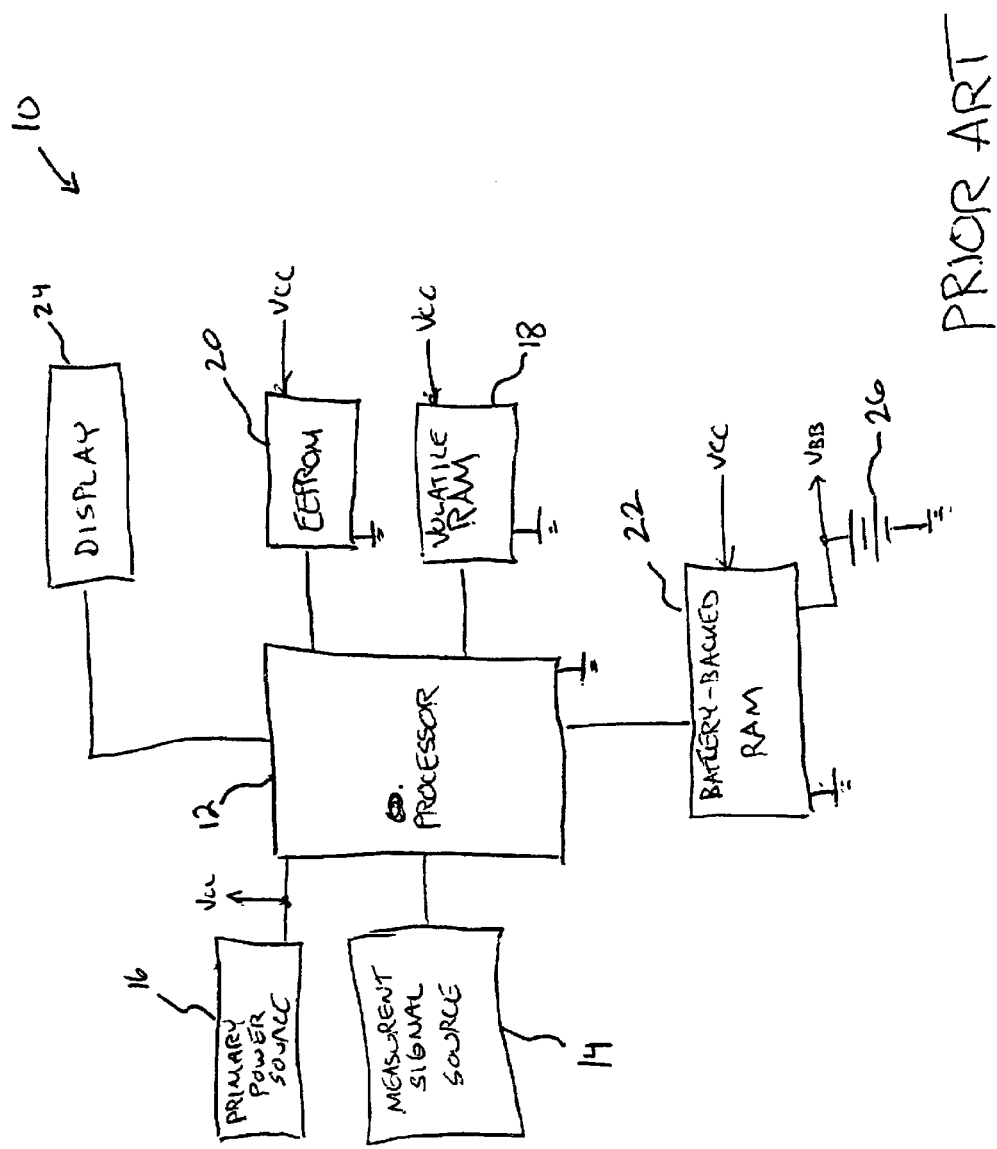
FIG. 1 shows a schematic block diagram of a prior art meter circuit.
Figure 2:
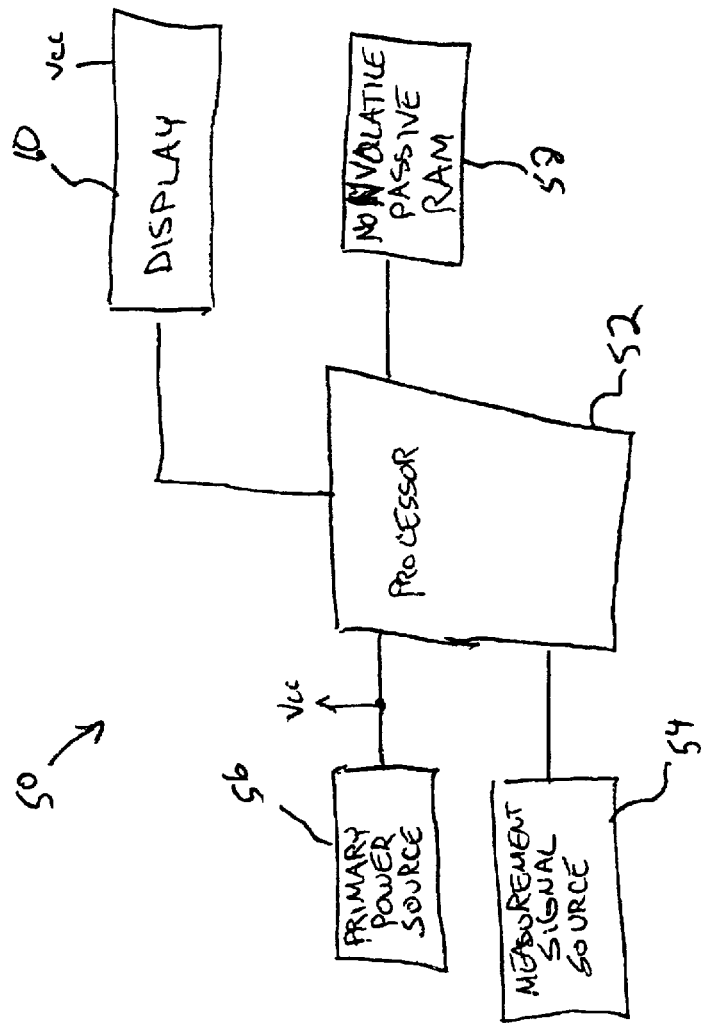
FIG. 2 show as schematic block diagram of an exemplary meter circuit according to the present invention.

FIG. 2 shows a utility meter circuit 50 in accordance with the present invention. The utility meter circuit 50 is operable to measure and generate metering information relating to the consumption or delivery of a commodity such as electricity, gas, or water. The meter 50 includes a processing circuit 52, a measurement signal source 54, a primary power source 56, a nonvolatile, rewriteable random access memory (NVRRAM) 58, a display 60.

The measurement signal source 54 is a circuit or device that generates signals representative of the measurement of a consumable commodity, such as gas, electricity or water. For example, in the case of an electricity meter, the measurement signal source 54 may be combination of digital and analog devices that generate raw energy consumption information. One example of a measurement signal source 54 is discussed below in connection with FIG. 3. However, various measurement signal sources that provide commodity consumption information are well known.

The measurement signal source 54 is operable to provide energy consumption information to the processing circuit 52. The processing circuit 52 generates metering information therefrom, which may suitably be stored in the NVR-RAM 58, stored in local RAM, not shown, within the processing circuit 52, and/or displayed. It is noted that the meter circuit 50 may include various other optional circuits/functions such as communication circuitry. It will be appreciated that at least some of the advantages of the present invention may be obtained even if other types of memories are included.

The primary power source 56 is operably connected to provide bias power to the components of the utility meter circuit 50, including the processing circuit 52, the measurement signal source 54, the NVRRAM 58 and the display 60. The primary power source 16 may suitably be a power supply that is coupled to utility electrical power. Such devices are well known.

The NVRRAM 58 is coupled to receive metering information from the processing circuit 52. The NVRRAM 58 stores such information in the event of a power interruption to the meter circuit 50. The NVRRAM 58 may also store calibration parameters of the meter circuit 50. The NVR-RAM is a random access memory that is non-volatile. By non-volatile, it is meant that the memory contents are not lost even if all electrical power is removed from the device. Examples of such devices include ferromagnetic RAMs and so-called ferro-electric RAMs.

It is preferable that calibration parameters be provided to a writeable memory such as the NVRRAM 58 because the parameters typically vary from meter to meter. Calibration parameters are used to adjust metering information for various conditions, typically including the variance of the response of sensor devices within the measurement signal source 54. For example, if a gas flow sensor is determined to be 8% inaccurate, appropriate calibration parameters may be employed by the processing circuit 52 to compensate for the error. Such parameters must be retained in the event of a power outage. Accordingly, the calibration parameters are stored in the NVRRAM 58.

In a preferred embodiment, the NVRRAM 58 is employed to store commodity consumption statistical data. Such information may include historical consumption information, such as the quantity of the commodity consumed for each of a large plurality of segments of time. One example of commodity consumption statistical data is load profiling data in an electricity meter. Load profiling data identifies the amount of electricity consumed for every n minute segment of time for a month or longer, where n is typically fifteen. Analogous profiling data may be obtained for other types of commodities.

In the operation of the meter circuit 50, the measurement signal source 54 generates commodity measurement signals and provides them to the processing circuit 52. The processing circuit 52 generates metering information from the commodity measurement signals. The metering information may include, but is not limited to, a running accumulator of the quantity of the commodity consumed. Metering information may also include various measurements relating to commodity consumption. For example, in an electricity meter, the metering information may include, in addition to real energy information, RMS voltage and current levels, power factor, and volt-amp information.

The processing circuit 52 may suitably include a single processor or plural processors configured to carry out the above described functions as well as others. In certain applications, it is advantageous to employ a digital signal processor in combination with another more general purpose processor to carry out the functions of the processing circuit of a meter.

The processing circuit 52 provides at least some of the generated metering information to the display 60. The display 60 provides a visual indication of the metering information. The visual indication may be used by the utility for billing purposes or the customer for tracking and/or control of commodity consumption.

In accordance with the present invention, the processing circuit 52 periodically provides the metering information to the NVRRAM 58. As a result, the running accumulator representative of cumulative commodity consumption is not lost in the event of a power interruption.

In the preferred embodiment, the processing circuit 52 also from time to time provides commodity consumption information to the NVRRAM 58 that may be used as statistical information. For example, the processing circuit 52 may generate a total commodity consumption value for a most recent increment of time, such as a minute, fifteen minutes, or an hour, and store that value along to the NVRRAM 58. At some subsequent time, the utility or the customer may retrieve the data from the meter may communications or via the display. That information again may be used to modify consumption tendencies or to alter billing amounts.

Such information is particularly valuable for electricity customers, who are billed in part based on their peak energy usage as opposed to merely their total energy usage. For example, a customer will typically pay more if the customer's energy usage is unbalanced, or in other words, concentrated in one or two hours of the day, as opposed to the same amount spread out evenly through the day. However, it is not always easy for a customer to identify whether it is using energy in an unbalanced manner. Accordingly, the statistical energy consumption data stored in the NVRRAM 58 may be used by the customer to identify such unbalanced usage and take remedial measures.

During normal operation, the primary power source 56 provides bias power to the various elements of the meter circuit 50. From time to time, however, the primary power source 56 does not deliver bias power to the meter circuit 50. For example, if the primary power source 56 is a power supply coupled to the electric utility power lines and there is a power failure, the primary power source 56 cannot provide sustained bias power. In such cases, the processor 52 and other elements may cease to operate, or may operate in a sleep mode using a low power reserve, not shown. Although power is removed from the NVRRAM 58, the NVRRAM 58 retains its memory contents including any stored metering information so that information is not permanently lost.

The present invention thus allows for the storage of such statistical metering information, cumulative metering information, and/or calibration information without having multiple types of the memories, and without the drawbacks of employing either battery-backed RAM or EEPROM alone to try to store all of such information. As discussed above, however, some of the benefits of the present invention can be realized even if less than all of the above information is stored in the NVRRAM 58, or even if other types of memory are included to some extent.

Figure 3:
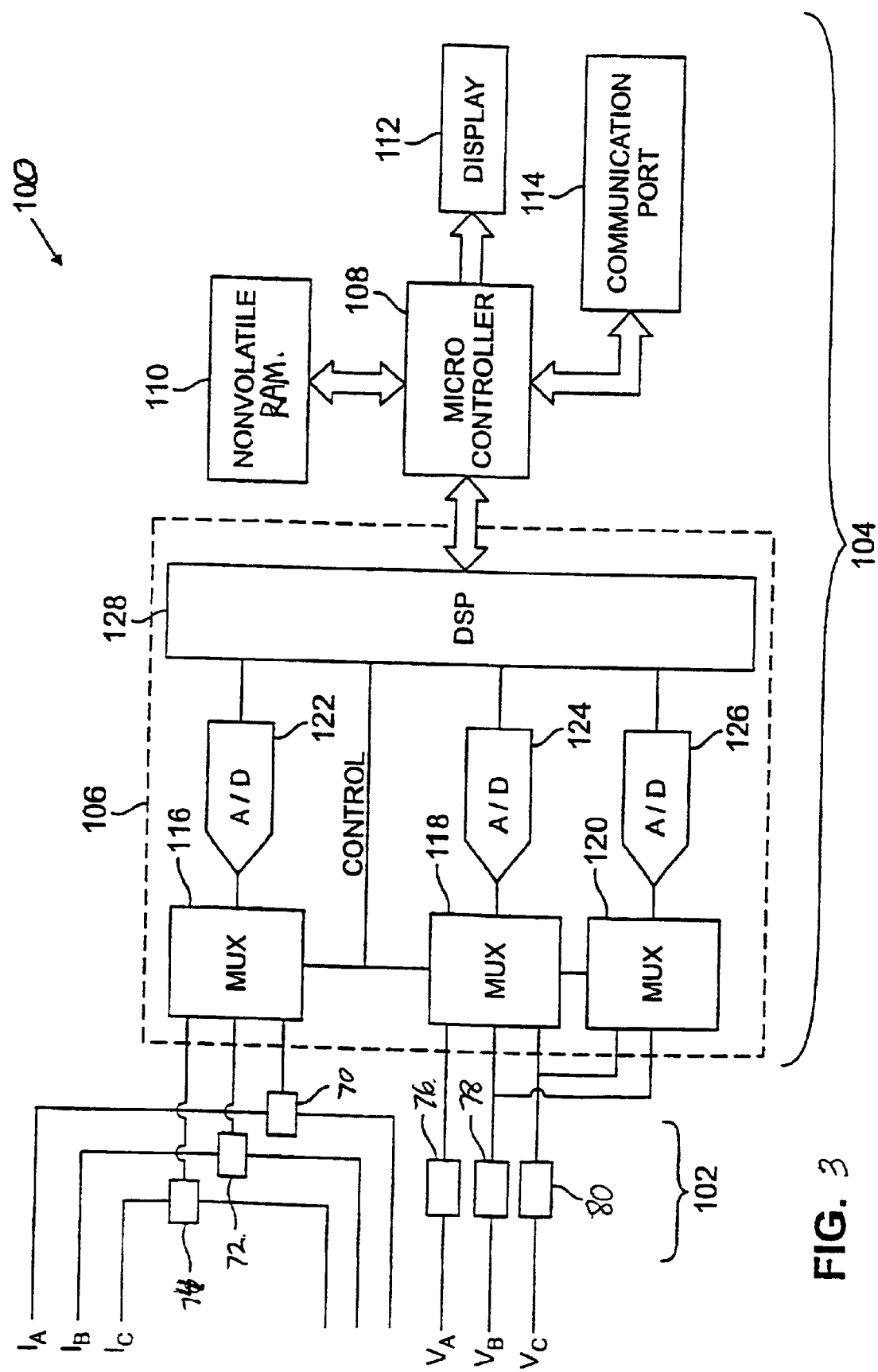
FIG. 3 show a schematic block diagram of an exemplary electricity meter circuit according to the present invention.

FIG. 3 shows an exemplary electricity meter circuit 100 that incorporates the principles of the present invention. It is given by way of example only. Many other implementations of the meter circuitry that incorporate the present invention as claimed below will benefit from the advantages provided by the claimed invention. The circuitry of the meter 100 is provided as a generalized example of a typical electronic meter used for metering electricity.

The meter 100 is configured to measure three phase power in a four-wire wye configuration as is known in the art. In particular, power is typically delivered to large industrial, commercial, and other large facilities in the form of three phase power over phase A, phase B and phase C power lines. Three phase power may be delivered in a so-called wye configuration, or a so-called delta configuration. Such configurations are well known in the art. In any event, the exemplary meter 100 is configured for three phase power connected in a wye configuration, but may readily be modified by those of ordinary skill in the art to measure power in three phase delta, single phase, or other wiring configurations. Indeed, as discussed further herein, the meter 100 can typically adapted to measure other wiring configurations by merely changing some of the operating characteristics of the measurement circuit 104.

In general, the meter 100 essentially comprises sensor circuitry 102 and measurement circuitry 104. The sensor circuitry 102 includes a polyphase current sensor, and more particularly, the phase A current sensor 70, the phase B current sensor 72, and the phase C current sensor 74. The sensor circuitry 102 further includes a polyphase voltage sensor, and more particularly, the phase A voltage sensor 76, the phase B voltage sensor 78, and the phase C voltage sensor 80. The measurement circuit 104 further comprises a conversion circuit 106, a processor 108, a nonvolatile rewriteable random access memory ("NVRRAM") 110, a display 112, and a communication port 114.

The NVRRAM 110 is a memory device that is randomly accessible, readable and writeable, yet does not require external power to retain its memory contents. Devices having such characteristics include, but are not limited to, ferromagnetic RAMs. Ferromagnetic RAMs are known in the art.

It is noted that in some prior art materials, the battery-backed RAM is often referred to as "nonvolatile" RAM. However, it will be appreciated that nonvolatile RAM as used herein means a RAM that does not lose its memory contents when all external power is removed, including any battery power.

The phase A current sensor 70 is connected to receive a signal indicative of the current waveform flowing through the phase A power line. The phase A current sensor 70 is further connected to the measurement circuit 104 through a first multiplexer 116. The phase A current sensor 70 may comprise a current transformer or any other device known in the art that detects current from the power line and produces a signal indicative of the detected current waveform. The first multiplexer 116 is a part of the conversion circuit 106, discussed further below.

Similarly, the phase B current sensor 72 is connected to receive a signal indicative of the current waveform flowing through the phase B power line. The phase B current sensor 72 is also connected to the measurement circuit 104 through the first multiplexer 116. Likewise, the phase C current sensor 74 is connected to receive a signal indicative of the current waveform flowing through the phase C power line. The phase C current sensor 74 is likewise connected to the measurement circuit 104 through the first multiplexer 116. The phase B current sensor 72 and the phase C current sensor 74 preferably have the same structure as the phase A current sensor 70.

In alternative embodiments, such as one in which the voltage on the power lines is particularly high, the current sensors 70, 72 and 74 are configured to measure the current waveform on the power lines indirectly through external transformers. In such an embodiment, the first, second, and third external scaling transformers, not shown, would be connected between the power lines and the current sensors 70, 72 and 74, respectively.

Referring to the polyphase voltage sensor, the phase A voltage sensor 76 is typically connected directly to the phase A power line to obtain a voltage measurement therefrom. To this end, the phase A voltage sensor 76 may suitably comprise a high resistance voltage divider. The phase A voltage sensor 76 is further connected to the measurement circuit 104 through a second multiplexer 118. Like the first multiplexer 116, the second multiplexer 118 is a part of the conversion circuit 106 and is discussed further below. The phase B voltage sensor 78 is likewise connected to obtain a voltage measurement from the phase B power line, and is further connected to provide the voltage measurement to the second multiplexer 118. The phase C voltage sensor 80 has a similar structure and is connected to the phase C power line and the multiplexer 118 in an analogous manner as the phase A voltage sensor 76 and the phase B voltage sensor 78.

In general, the conversion circuit 106 is a circuit operable to receive polyphase voltage and polyphase current measurement signals and generate digital signals therefrom, the digital signals including a power consumption signal and voltage and current signals. In the exemplary embodiment described herein, the conversion circuit 106 comprises first, second and third multiplexers, 116, 118, and 120, respectively, first, second, and third analog to digital converters ("A/Ds") 122, 124 and 126, respectively, and a digital signal processor 128. The above listed components of the conversion circuit 106 may suitably be incorporated onto a single semiconductor substrate. An example of a suitable conversion circuit is the Power Measurement Integrated Circuit found in a model S4 electrical utility meters available from Siemens Power Transmission & Distribution, Inc., of Wendell, N.C. Other suitable devices may include comparable elements in the meter disclosed in U.S. Pat. No. 5,537,029, the disclosure of which is incorporated herein by reference.

The processor 108 is operably configured to, and executes programming instructions to, receive the digital signals from the conversion circuit, and generate metering information therefrom. The processor 108 may suitably be a commercially available microcontroller. The processor 108 generally includes firmware, or in other words, an integrated ROM, not shown, into which programming instructions are stored. In accordance with one embodiment of the present invention, however, many if not all of the programming instructions may be stored in the NVRRAM 110. By storing some or all of the programming instructions in the NVRRAM 110, more functionality may be programmed into the processor 108 without requiring increased ROM or RAM within the processor 108 and without requiring additional external ROM and/or RAM capacity.

The third multiplexer 120 and third A/D 126 provide additional capabilities to the meter 10 that are outside the scope of the present invention.

With reference to FIGS. 2 and 3, the signal measurement source 54 of the exemplary embodiment of FIG. 3 includes the sensor circuit 102, while the processing circuit 52 includes the conversion circuit 106 and the processor 108. As discussed above, however, other types of signal measurement sources and other specific embodiments of the processing circuit 52 may readily be devised by those of ordinary skill in the art.

In operation, the phase A, B and C current sensors 70, 72, and 74, respectively, detect the phase A current, the phase B current, and the phase C current, and generate current measurement signals therefrom. The phase A current sensor 70 then provides the phase A current measurement signal to the first multiplexer 116, the phase B current sensor 72 provides the phase B current measurement signal to the first multiplexer 116, and the phase C current sensor 74 provides the phase C current measurement signal to the first multiplexer 116. The current measurement signals typically have a voltage level that is indicative of the instantaneous current level on their respective phases. For current transformers designed for utility meter use, the current measurement signals measure from 0.0 volts to 0.3 volts maximum. Other scaling factors may of course be employed.

The first multiplexer 116, under the control of the processor 108, then provides the instantaneous current measurement signal from one of the phase A, phase B, or phase C current measurement signals to the first A/D converter 122. The first multiplexer 116 typically provides each phase in rapid succession of cycles, such that each phase is provided to the first A/D converter 122 every third cycle. According to the exemplary embodiment described herein, the first multiplexer 116 provides the current measurement signals to the first A/D converter 122 at a rate of 3.3 kHz.

The first A/D converter 122 receives and samples or digitizes the rapid succession of instantaneous current measurement signals. The first A/D converter 122 then provides to the DSP 128 a stream of digital words, each representing the magnitude of one of the three phase currents at a particular instant.

Contemporaneously, the phase A, B and C voltage sensors 76, 78, and 80, respectively, detect the phase A voltage, the phase B voltage, and the phase C voltage, and generate voltage measurement signals therefrom. The phase A voltage sensor 76 provides the phase A voltage measurement signal to the second multiplexer 118, the phase B voltage sensor 78 provides the phase B voltage measurement signal to the second multiplexer 118, and the phase C voltage sensor 80 provides the phase C current measurement signal to the second multiplexer 116. Each voltage measurement signal is typically a signal having a voltage level that is indicative of the instantaneous voltage level on its respective phase. In the exemplary embodiment described herein, the voltage sensors are configured to provide voltage measurement signals that range from 0.0 volts to 0.3 volts maximum. Again, other scaling factors may be employed.

The second multiplexer 118 then provides each phase voltage measurement signal in a rapid succession of cycles, such that the measurement signal from each phase is provided to the second A/D converter 124 every third cycle. According to the exemplary embodiment described herein, the second multiplexer 118 provides the voltage measurement signals at the same rate as that used by the first multiplexer 116 to provide the current measurement signals to the first A/D converter 122. Moreover, the first multiplexer 116 and the second multiplexer 118 operate in a coordinated fashion to provide certain phase current measurement signals at the same time as certain phase voltage measurement signals. For example, in a four wire wye meter wiring configuration, the first multiplexer 116 provides the phase x current measurement signal and the second multiplexer 118 provides the phase x voltage measurement signal contemporaneously, where x rotates among A, B and C.

The second A/D converter 124 receives and samples or digitizes the rapid succession of instantaneous voltage measurement signals. The second A/D converter 124 thus provides to the DSP 128 a stream of digital words or samples, each representing the magnitude of one of the three phase voltage measurement signals at a particular instant. The first A/D converter 122 and the second A/D converter 124 thus provide the digital voltage and current measurement signals in a predetermined synchronous phase relationship. The DSP 128 within the conversion circuit 106 the determines power consumption by selectively multiplying the digital voltage measurement signal samples and the digital current measurement signal samples received from the A/D converters 122 and 124, and then adding them together.

In particular, in a four wire wye meter wiring configuration, the appropriate power calculation is:

$$POWER = V_A I_A + V_B I_B + V_C I_C \quad (1)$$

The DSP 128 carries out the above calculation in the manner described herebelow. The DSP 128 receives from the A/D converters 122 and 124 a digital current measurement signal sample and a voltage measurement signal sample. The DSP 128 multiplies the received samples, and the resulting product is added to a running total or sum. The DSP 128 then receives the next set of digital current and voltage measurement signal samples and repeats the process. In other words, if $DIG\_VOLT_x$ is digital voltage measurement signal for a phase x and $DIG\_CURR_x$ is the digital current measurement signal for the phase x, then the DSP 128 carries out the following calculation:

$$POWER = SUM\ (DIG\_VOLT_x * DIG\_CURR_x)\ for\ x=\{A,B,C,A,B,\ldots\} \quad (2)$$

From time to time, the DSP provides power consumption data derived from POWER to the processor 108.

The processor 108 accumulates the power consumption data until a predefined watt-hour threshold has been reached. At that point, the processor 108 generates a power consumption pulse and increments a power consumption counter. The power consumption counter is the number by which customer energy consumption is tracked. For example, as is well known, a utility may determine a particular customer's consumption for a particular billing cycle by subtracting the power consumption counter value at the beginning of the billing cycle from the power consumption counter value at the end of the billing cycle. The processor 108 preferably provides the power consumption counter information to both the nonvolatile RAM 110 and the display 112. The display 112 then provides a visual representation of the power consumption counter information from which readings may be taken by utility personnel.

The nonvolatile RAM 110 stores the power consumption counter information for the purposes of retention in the case of a power interruption. Because the nonvolatile RAM 110 has comparably inexhaustible write-cycle capabilities, i.e., it may be written to and rewritten substantially more than EEPROM technology, the power consumption counter information or other meter information may be written to nonvolatile RAM 110 on a constant basis, and not necessarily only upon an indication of a power failure, as was common in the prior art. In fact, the power consumption information may be written to the nonvolatile RAM 110 each time it is updated by the processor 108. In this manner, special shut-down routines that store metering information to nonvolatile memory on the onset of a power outage are not required. Even if such routines are necessary for other purposes, at least such routines do not have to also store the metering information to nonvolatile memory. Reducing the operations required on power outage is advantageous because stored energy is required to power such routines. Accordingly, it is also advantageous avoid the energy consumption associated with writing metering information to a EEPROM during the shut-down routine.

In addition, during normal operation, the processor 108 may further provides the power consumption counter information, as well as other information, to the communication port 114. The communication port 114 may then communicate the information over an external communication means, such as a public telephone network, to a central processing facility for the utility. In this manner, the utility may track and bill for power consumption registered by the meter 10 without requiring an employee to physically view the meter.

The processor 108 also generally controls the operation of the conversion circuit 106, and particularly, the first, second, and third multiplexers 116, 118 and 120, respectively, the first, second, and third A/D converters 122, 124 and 126, respectively, and the digital signal processor 128. Again, to this end, the processor 108 executes programming instructions that may suitably be stored in the nonvolatile RAM 110.

In addition to metering energy consumption, the DSP 128 also determines and provides other metering information to the processor 108. In particular, the DSP 128 provides for each phase, the measured voltage magnitude and phase angle data, and the measured current magnitude and phase angle data.

To determine the measured voltage and current magnitude data, the DSP 128 performs an RMS calculation on each digital voltage and current measurement signal. This calculation may for example, include, for each phase voltage and current, squaring each sample of the digital measurement signal, and taking the mean of the squared samples over time.

To determine phase angles for each voltage, the DSP 128 uses the time differences between the zero crossings of the phase voltage signals. The time difference between the zero crossing of a particular signal $V_x$ and the $V_A$ signal, plus the direction of the respective zero crossings, provides the phase information. Current phase information is determined using watts per phase and VAR per phase. In particular, a current phase angle for phase x is given by arctan ($VAR_x/WATTS_x$).

The DSP 128 provides the measured voltage and current magnitude and phase angle data to the processor 108. Table 1, below shows the measured values so provided.

TABLE 1

$VRMS_A$ = Phase A voltage magnitude
$VRMS_B$ = Phase B voltage magnitude
$VRMS_C$ = Phase C voltage magnitude
$IRMS_A$ = Phase A current magnitude
$IRMS_B$ = Phase B current magnitude
$IRMS_C$ = Phase C current magnitude
$V<_A$ = Phase A voltage phase angle
$V<_B$ = Phase B voltage phase angle
$V<_C$ = Phase C voltage phase angle
$I<_A$ = Phase A current phase angle
$I<_B$ = Phase B current phase angle
$I<_C$ = Phase C current phase angle It is noted that the processor 108 may be required to perform some further conversion on the measured data to put it in the form identified in Table 1.

The processor 108 may also use the resulting measured consumption data to perform diagnostic routines, such as those described in U.S. Pat. No. 6,043,642, already incorporated herein. During any or all of the calculations of the processor 108, the processor 108 may store interim values in the NVRRAM 110. Use of the NVRRAM 110 for such purposes may expand the capability of the processor 108 without requiring extra internal RAM. While an external RAM may be added for the same purpose, the use of the NVRRAM 110, which is already implemented in the meter 100 for other purposes, potentially eliminates the need to add yet another memory device within the meter 10. Nevertheless, the processor 108 need not store interim values into the NVRRAM 110 to obtain most of the benefits of the present invention.

It is further possible that the processor 108, either alone or in combination with other processors or devices, would generate metering information in the form of load profiling information. Load profiling is typically an optional metering feature that tracks one or more energy consumption values for sequential time periods. For example, watt-hours consumed, VAR-hours consumed, average power factor, average phase angles, and other information may be generated and stored every fifteen minutes for the each fifteen minute period. At some point, typically monthly, a metering technician (or the consumer) downloads the information, which clears the memory. However, large amounts of memory are required. As discussed above, prior systems required a battery-backed RAM to store the information. While EEPROM could be used, the write-cycle limitations of EEPROMs often outweigh their benefits in load profiling implementations.

Accordingly, the present invention, by employing the NVRRAM 110, both eliminates the need for the battery-backed RAM and its associated battery circuitry and eliminates yet another different type of memory that must be addressed, connected, and organized.

It is furthermore noted that many meters have the ability to alter the operation of the DSP 128 to accommodate other meter forms. For example, U.S. Pat. No. 5,548,527 to Hemminger et al., the disclosure of which is incorporated herein by reference, shows a meter having an architecture with a DSP, controller, A/D converters and the like similar to that described above. That patent discusses how the meter formulae and calibration constants may be stored in non-volatile memory (EEPROM). That information is then either accessed by, or downloaded to, the DSP so that the DSP can perform the appropriate energy calculations for the installation. If the installation changes, however, new calibration constants and meter formulae may be programmed into the EEPROM. In accordance with the present invention, such meter formulae and/or the calibration constants may be downloaded into the NVRRAM 110. To program new meter formulae or calibration constants (or new meter software in general), an external device may be used to communication such information through the communication port 114 via the processor 108.

As a result, the specific implementations of the NVRRAM 110 in meters such as those discussed above, including the meter 100, can not only replace current EEPROM usage in such meters, but furthermore consolidate various memory operations having various requirements specific to the metering industry and the general electronic metering architecture.

It will be appreciated that the above embodiments are merely illustrative, and that those of ordinary skill in the art may readily devise their own implementations that incorporate the principles of the present invention and fall within the spirit and scope thereof.

We claim:

1. An arrangement for generating and storing metering information in a meter for measuring a consumed commodity, the arrangement including:
   a) a processing circuit operable to receive commodity consumption information and generate metering information therefrom;
   b) a non-volatile, rewriteable random access memory for storing the metering information during normal operation, the non-volatile, rewriteable random access, memory operable to retain the stored metering information in the absence of electrical power from a source external to the non-volatile, rewriteably random access memory.

2. The arrangement of claim 1 wherein the meter comprises an electricity meter and wherein:
   the processing circuit is operable to generate load profiling information, said load profiling information including energy usage information for a plurality of time periods; and
   wherein the non-volatile rewriteable random access memory is further operable to store the load profiling information.

3. The arrangement of claim 1 wherein the meter comprises an electricity meter and wherein:
   the processing circuit is operable to generate metering information using one of a plurality of sets of meter formulae;
   the non-volatile rewriteable random access memory is further operable to store the one of the plurality of sets of meter formulae.

4. The arrangement of claim 3 further comprising an external communication port and wherein the one of the plurality of sets of meter formulae stored in the non-volatile rewriteable random access memory may be replaced with a different one of the plurality of sets of meter formulae via communication with an external device through the external communication port.

5. The arrangement of claim 1 wherein the meter comprises an electricity meter and wherein:
   the processing circuit is operable to generate metering information using a first set of calibration information; and
   the non-volatile rewriteable random access memory is further operable to store the first set of calibration information.

6. The arrangement of claim 5 further comprising an external communication port and wherein the first set of calibration information may be replaced with a second set of calibration information via communication with an external device through the external communication port.

7. The arrangement of claim 1 wherein the non-volatile rewriteable random access memory is a ferromagnetic RAM.

8. The arrangement of claim 1 wherein the non-volatile rewriteable random access memory further stores at least one interim metering variable generated by the processing circuit and subsequently retrieved by the processing circuit for calculation of a metering value.

9. The arrangement of claim 1 wherein the non-volatile rewriteable random access memory further stores program code executed by the processing circuit.

10. The arrangement of claim 1 wherein:
    the processing circuit is operable to generate statistical commodity consumption information, said statistical commodity consumption information including commodity usage information for a plurality of time periods; and wherein the non-volatile rewriteable random access memory is further operable to store the statistical commodity consumption information.

11. The arrangement of claim 1 wherein the processing circuit includes plural processing devices, said plural processing devices including a digital signal processor.

12. An arrangement for generating and storing metering information in an electricity racier for measuring consumed energy, the arrangement including:

a) a processing circuit operable to receive energy consumption information and generate metering information therefrom, said metering information including load profiling information;

b) a non-volatile, rewriteable random access memory for storing the metering information during normal operation, the non-volatile, rewriteable random access memory operable to retain the stored metering information in the absence of electrical power from a source external to the non-volatile, rewriteably random access memory, said non-volatile, rewriteable random access memory further storing at least some program code executed by the processing circuit.

13. An arrangement for generating and storing metering information in an electricity meter for measuring consumed energy, the arrangement including:

a) a processing circuit operable to receive energy consumption information and generate metering information using the received energy consumption information and a first set of calibration information;

b) a non-volatile, rewriteable random access memory for storing the first set of calibration information and for storing the metering information during normal operation, the non-volatile, rewriteable random access memory operable to retain the calibration information and the stored metering information in the absence of electrical power from a source external to the non-volatile, rewriteably random access memory.

* * * * *